(12) United States Patent
Lui et al.

(10) Patent No.: US 7,565,390 B1
(45) Date of Patent: Jul. 21, 2009

(54) CIRCUITRY FOR FACILITATING PERFORMANCE OF MULTIPLY-ACCUMULATE OPERATIONS IN PROGRAMMABLE LOGIC DEVICES

(75) Inventors: Tat Mun Lui, Selangor (MY); Bee Yee Ng, Pahang (MY); Jun Pin Tan, Kuala Lampur (MY); Boon Jin Ang, Penang (MY)

(73) Assignee: Altera Corporation, San Jose, CA (US)

( * ) Notice: Subject to any disclaimer, the term of this patent is extended or adjusted under 35 U.S.C. 154(b) by 1025 days.

(21) Appl. No.: 11/089,684

(22) Filed: Mar. 23, 2005

(51) Int. Cl.
*G06F 7/48* (2006.01)
(52) U.S. Cl. .................................... 708/606
(58) Field of Classification Search ................ None
See application file for complete search history.

(56) References Cited

U.S. PATENT DOCUMENTS 5,847,981 A * 12/1998 Kelley et al. ............... 708/603
7,231,510 B1 * 6/2007 Nguyen et al. ............. 712/218
7,472,155 B2 * 12/2008 Simkins et al. ............ 708/523
2004/0139131 A1 * 7/2004 Guevokian et al. .......... 708/233

* cited by examiner

*Primary Examiner*—David H Malzahn
(74) *Attorney, Agent, or Firm*—Ropes & Gray LLP; Robert R. Jackson

(57) ABSTRACT

In circuitry such as a programmable logic device ("PLD"), each of several multiplier blocks includes partial products generation circuitry and partial products addition circuitry. Two such multiplier blocks can be used together to provide multiply-accumulate ("MAC") capability. The partial products addition circuitry in one of the paired blocks is used to add each successive product produced by the other paired block to a previous accumulation of products in the first-mentioned paired block. Provisions are also made for accumulating any overflow from operation of the partial products addition circuitry in the first-mentioned paired block.

26 Claims, 5 Drawing Sheets

US 7,565,390 B1

CIRCUITRY FOR FACILITATING PERFORMANCE OF MULTIPLY-ACCUMULATE OPERATIONS IN PROGRAMMABLE LOGIC DEVICES

BACKGROUND OF THE INVENTION

This invention relates to programmable logic devices ("PLDs") such as field-programmable gate arrays ("FPGAs"), and more particularly to circuitry for facilitating the performance of multiply-accumulate operations in PLDs.

PLDs typically include many identical or substantially identical blocks of programmable logic. A PLD may also include multiple instances of several other types of circuit blocks such as input/output ("I/O") blocks, phase-locked loop and/or delay-locked loop ("PLL/DLL") blocks, memory (e.g., RAM) blocks, digital signal processing ("DSP") blocks, etc. These other types of blocks may be programmable with respect to some aspects of their operations. Typically, all of the functional blocks on a PLD can be interconnected in many different ways by interconnection resources of the PLD, which resources may also be programmable in various respects.

A typical capability of a DSP block on a PLD is the ability to perform a multiplication operation. The DSP blocks of some PLDs are not able to additionally accumulate (add) successive products produced by the DSP block, as is required to perform a multiply-accumulate ("MAC") operation. If a MAC operation is required in such PLDs, the successive products produced by the DSP block must be accumulated in some of the more general-purpose programmable logic blocks of the PLD. This can have certain disadvantages such as relatively slow operation, use of significant numbers of programmable logic blocks that it might be desirable to have available for other purposes, use of significant amounts of interconnection resources (e.g., for routing DSP block products to the programmable logic blocks performing the accumulation), etc.

SUMMARY OF THE INVENTION

In accordance with this invention, at least some of the DSP blocks on a PLD are enhanced with circuitry for enabling partial products addition circuitry of one DSP block to be used to accumulate successive products produced by another DSP block. In a preferred embodiment, direct connections are provided from one DSP block to another DSP block so that successive products from the first-mentioned DSP block can be routed into circuitry of the second-mentioned DSP block that can selectively perform an accumulation. Also to support accumulation, circuitry is added to the second-mentioned DSP block for selectively feeding the output of that DSP block back to partial products addition circuitry of that DSP block.

If desired, product accumulations larger in size than the maximum number of bits for any one product can be supported. For example, overflow from the DSP block forming the basic product accumulation can be routed back to otherwise unused (and enhanced) resources of the DSP block that is producing the products being accumulated. That overflow can be accumulated in the just-mentioned resources of the receiving DSP block.

Further features of the invention, its nature and various advantages will be more apparent from the accompanying drawings and the following detailed description.

DETAILED DESCRIPTION

Figure 1:
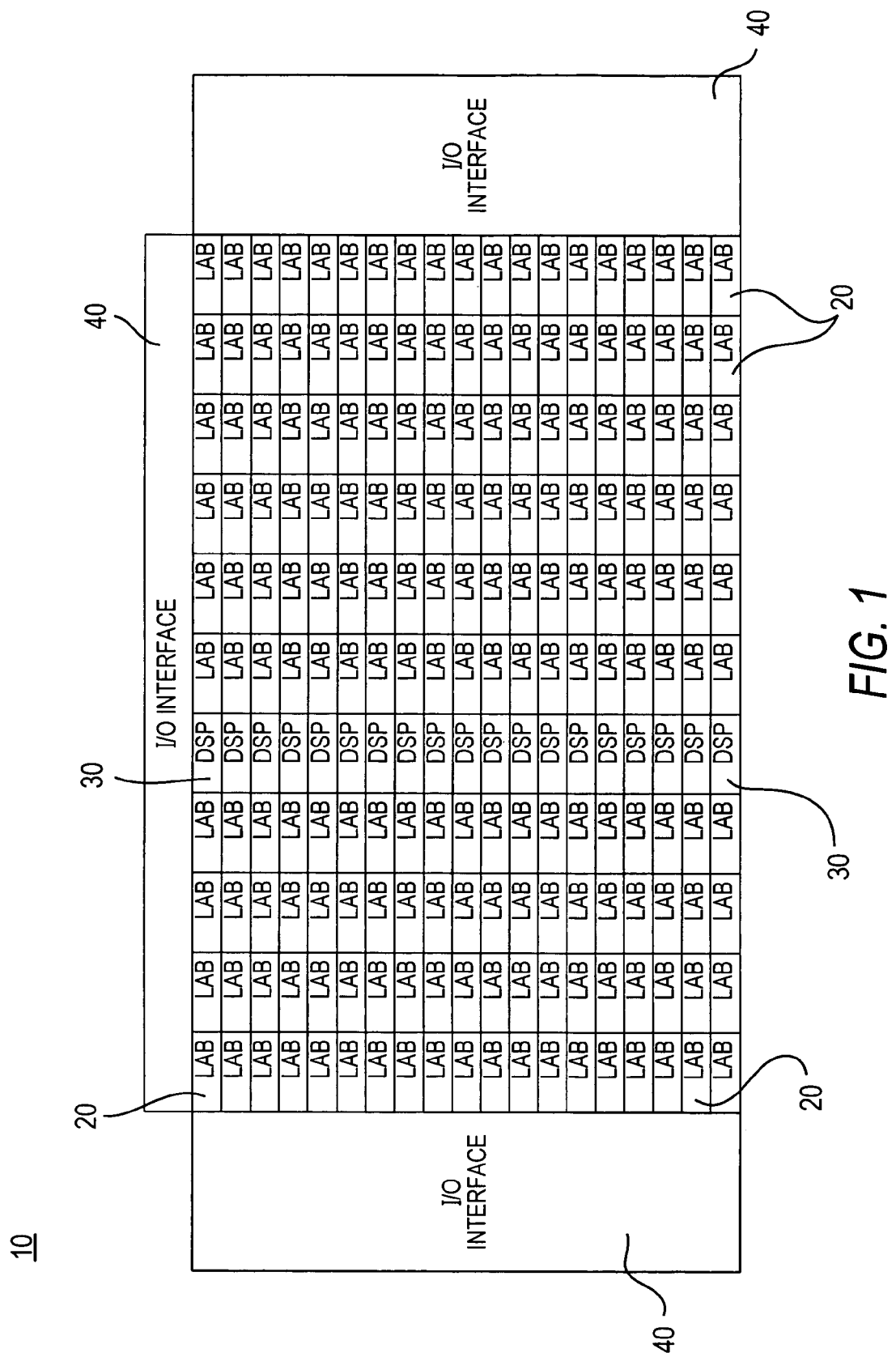
FIG. 1 is a simplified block diagram of a PLD layout that is basically known but that can be constructed employing circuitry in accordance with this invention.

An illustrative PLD layout that is basically known is shown in FIG. 1. As shown in that FIG., PLD 10 includes a two-dimensional array of intersecting rows and columns of circuit blocks 20 and 30. Blocks 20 are blocks of relatively general-purpose programmable logic called logic array blocks or LABs. Each of LABs 20 is programmable to perform any of many different logic functions. Each of LABs 20 may also include a number of registers (flip-flops) for selectively registering signals in or applied to the LAB. Blocks 30 are digital signal processing or DSP blocks. Note that in this embodiment DSP blocks 30 are disposed adjacent to one another in a column. PLD 10 also includes areas of input/output ("I/O") interface circuitry 40 near the periphery of the device. Although not shown in FIG. 1, it will be understood that PLD 10 also includes a network of interconnection conductors. This network is programmable in at least some respects to convey signals to, from, and/or between the other circuitry on the device in any of many different possible ways.

Figure 2:
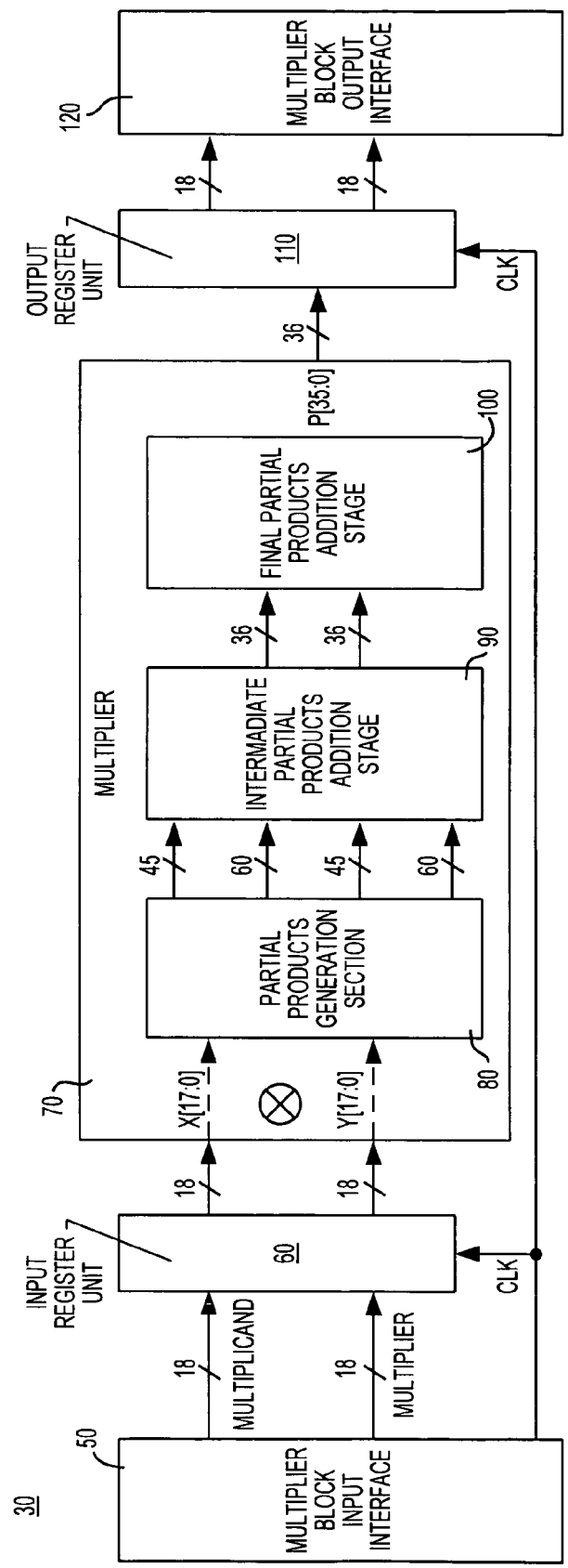
FIG. 2 is a simplified schematic block diagram of a representative one of the blocks in FIG. 1 when that block has a known construction.

FIG. 2 shows an illustrative conventional embodiment of a representative one of DSP blocks 30. In this embodiment DSP block 30 is basically a multiplier. The components of DSP block 30 are multiplier block input interface circuitry 50, input register circuitry 60, multiplier 70, output register circuitry 110, and multiplier block output interface circuitry 120. Input interface circuitry 50 connects signals into DSP block 30 from the interconnection resources (circuitry) of PLD 10. For example, these signals may include a multiplicand value of up to 18 binary digits ("bits") and a multiplier value of up to 18 bits. Input registers 60 can register these signals and then apply them to multiplier circuitry 70. Multiplier 70 multiplies the two applied values together and outputs the resulting product value. The product value can include up to 36 bits. Output registers 110 can register the product value and then apply that value to output interface 120. The output interface can connect the product signals into the interconnection resources of the PLD.

FIG. 2 further shows that the components of multiplier 70 include partial products generation section or circuitry 80, intermediate partial products addition stage or circuitry 90, and final partial products addition stage or circuitry 100. In partial products generation stage 80, a number of partial products are generated based on the multiplier and multiplicand input size. Then in partial products addition stages 90 and 100 the partial products are added together to produce the final product output. This is shown in FIG. 2 as involving two stages to shift the partial products and to handle the sum and carry bits of the addition. In the particular embodiment shown in FIG. 2 partial products generation section 80 converts the 18-bit multiplicand and 18-bit multiplier into four groups of partial products to be added together in intermediate partial products addition stage 90. In stage 90 the four groups of partial products are reduced to two terms of 36 bits each. These terms are then added together in final partial products addition stage 100 to produce the final 36-bit output.

It will be apparent from the foregoing that the conventional DSP block 30 shown in FIG. 2 does not include the capability to accumulate (add) successive products, as is required, for example, for a multiply-accumulate ("MAC") operation. Any required accumulation of successive products must therefore be performed in the general-purpose logic circuitry 20 of PLD 10. This has disadvantages of the kind described in the background section of this specification.

Figure 3:
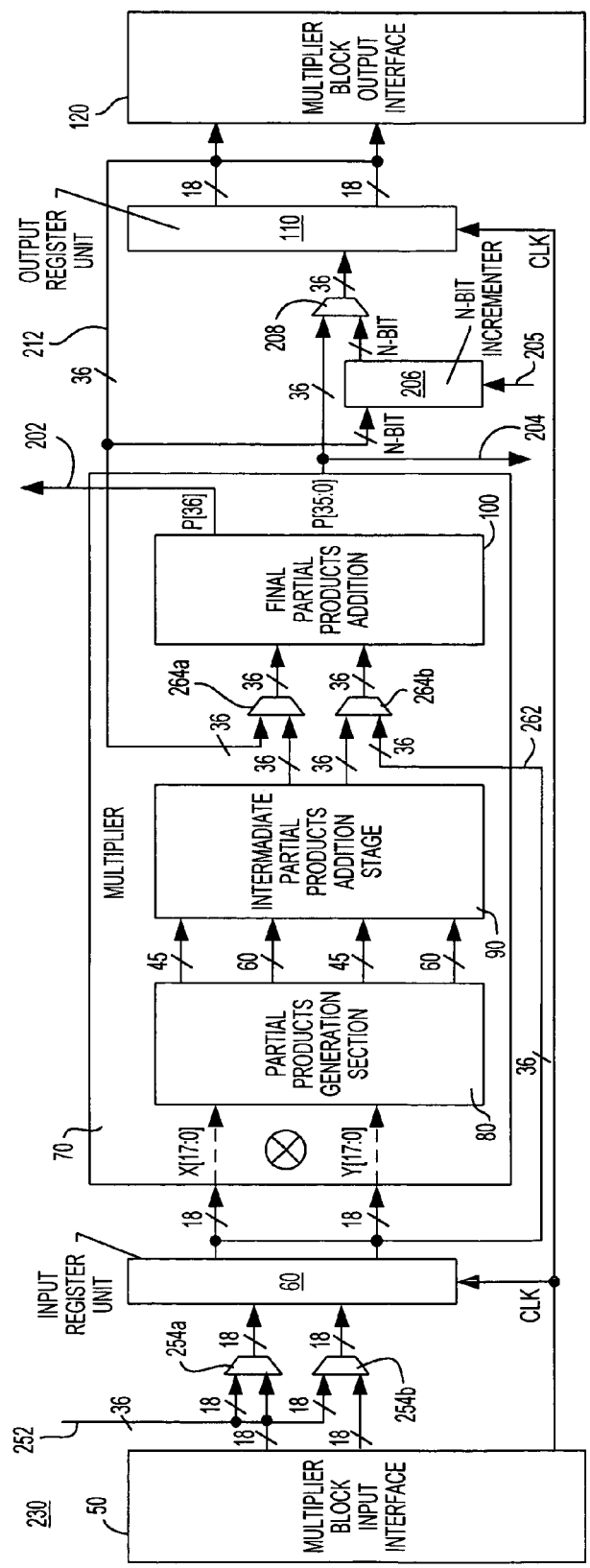
FIG. 3 is a simplified schematic block diagram of an illustrative embodiment of modification of the FIG. 2 circuitry in accordance with the invention.

FIG. 3 shows an illustrative embodiment of modification of DSP block 30 in accordance with the invention. The purpose of these modifications is to allow two DSP blocks to work together to perform a MAC operation if that is what is desired. If MAC operation is not desired, then each modified DSP block can perform multiplication as described above for DSP block 30. It is assumed in this embodiment and the discussion thereof herein that the DSP blocks are adjacent to one another (e.g., in a column as shown for DSP blocks 30 in FIG. 1), and more particularly that the two DSP blocks that work together as a MAC are immediately adjacent to one another in such an arrangement. It will be understood that these are not requirements in all embodiments of the invention, and that DSP blocks in accordance with the invention can be organized on a PLD in other ways if desired.

In FIG. 3 the DSP block is renumbered 230 to reflect the fact that it is a modified version of DSP block 30 (FIG. 2). Elements in FIG. 3 that are the same (or basically the same) as elements in FIG. 2 have the same reference numbers in both of these FIGS. Elements that are new in FIG. 3 (as compared to FIG. 2) have reference numbers in the 200 series. The following discussion can deal mostly with these new (200-series) elements because the other elements have already been discussed in connection with FIG. 2. Although the invention could be implemented by modifying only two DSP blocks in complementary fashion, it will be assumed herein that at least several adjacent DSP blocks in a column are modified all in the same way. This will allow any two adjacent DSP blocks in the column to work together to operate as a MAC. DSP block 230 in FIG. 3 is representative of one such block, and it includes added connections to the identical blocks (not shown) above and below it so that it can pair with either the block above or the block below to provide a MAC. In sum, any or all of DSP blocks 30 in FIG. 1 can be DSP blocks 230 as shown in FIG. 3.

In the representative DSP block 230 shown in FIG. 3, conductors 252 are so-called "sneak" connections from the identical DSP block above. In particular, conductors 252 in each DSP block 230 come from the conductors 204 in the DSP block 230 above the depicted DSP block. Conductors 204 carry the output signals of the multiplier circuitry 70 in the associated DSP block 230. It will be noted that there are 36 conductors 204/252.

Figure 5:
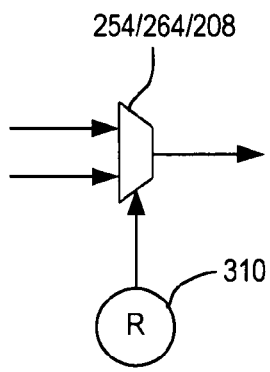
FIG. 5 is a simplified schematic block diagram showing an illustrative embodiment of a representative portion of the FIG. 3 or FIG. 4 circuitry in somewhat more detail.

Multiplexers 254a and 254b allow either the signals on conductors 252 or signals from multiplier block input interface circuitry 50 to be selected as the signals applied to input registers 60. Multiplexers 254 are typically programmably controlled to make this selection. For example, this programmable control of multiplexers 254 may come from one or more programmable RAM bits on the PLD that includes the circuitry. All of the multiplexers shown and described herein (e.g., multiplexers 264a, 264b, and 208) may have programmable control similar to that just described for multiplexers 254. FIG. 5 is a generalized depiction of such control in which programmable RAM bit 310 controls which of the two inputs to multiplexer 254/264/208 the multiplexer selects to be its output.

Conductors 262 and multiplexers 264b are added to allow the output signals of input registers 60 to bypass partial products generation circuitry 80 and intermediate partial products addition circuitry 90 if desired. In particular, multiplexers 264b are programmably controllable to output either the signals from registers 60 (on leads 262) or a partial product from intermediate partial products addition circuit 90. Again, it will be noted that there are 36 conductors 262.

Conductors 212 and multiplexers 264a are added to allow the output signals of output register 110 to be applied to final partial products addition circuitry 100 in lieu of one of the partial products from intermediate partial products addition circuitry 90 if desired. Once again there are 36 conductors 212.

Final partial products addition circuitry 100 in DSP block 230 is augmented with a 37th output 202. This is an "overflow" output which conveys any extra digit (bit) that may result from addition of two 36-bit numbers, especially in MAC mode. The output 202 from one DSP block 230 is the input 205 to the DSP block 230 above the first-mentioned block.

N (or n) of leads 212 are tapped to provide N inputs to N-bit incrementer circuitry 206. N can be as large as the number of leads 212 (e.g., 36 in the depicted illustrative embodiment), but it is typically less. For example, N may be a number on the order of eight or nine. That is typically a value of N that is large enough to enable the circuitry to meet almost all likely needs. If N is less than all of leads 212, then the leads 212 thus tapped to feed incrementer 206 are preferably from the less significant bits output by output registers 110. The other input 205 to incrementer 206 is the output 202 of the DSP block 230 below the depicted DSP block in the column of such blocks. In each cycle of its operation, incrementer 206 adds the data bit on lead 205 to the least significant place of the data fed back (via leads 212) from the outputs of registers 110. Multiplexers 208 allow either the outputs of multiplier 70 or the outputs of incrementer 206 to be applied to registers 110. By using incrementer 206 and routing from incrementer 206 through multiplexers 208 to registers 110, any overflow from the accumulation of successive products in the DSP block below the one shown in FIG. 3 can be accumulated by depicted incrementer 206 and output from the DSP block via the components 110 and 120 of that DSP block.

Figure 4:
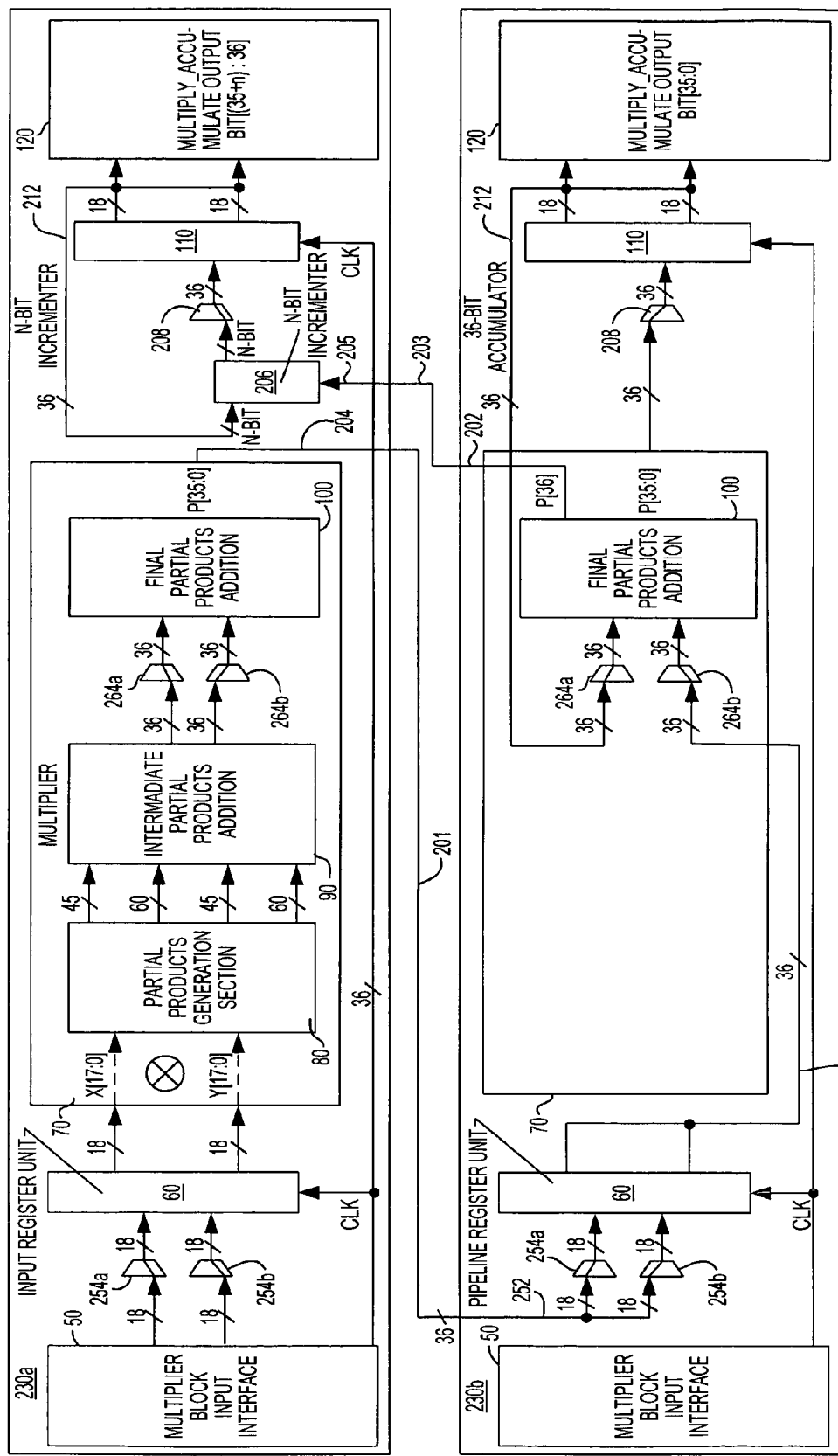
FIG. 4 is a simplified schematic block diagram showing an illustrative embodiment of use together of two circuitries of the type shown in FIG. 3 in accordance with the invention.

FIG. 4 shows two adjacent DSP blocks 230a and 230b being used to perform a MAC operation in accordance with the invention. DSP blocks 230a and 230b are preferably the same as one another (and the same as DSP block 230 in FIG. 3). However, only components of each of DSP blocks 230a and 230b that are actually in use to provide MAC operation are (in general) shown in FIG. 4.

In the arrangement shown in FIG. 4 DSP block 230a is used to perform the multiplication portion of the MAC operation, while DSP block 230b is used to perform most of the accumulation portion of the MAC operation. Overflow accumulation is performed by DSP block 230a. This will be explained more fully in the next several paragraphs.

The multiplication portion of the MAC operation is performed by the following elements in DSP block 230a: multiplier block input interface 50, multiplexers 254a and 254b (programmed to route multiplier and multiplicand data from input interface 50 to multiplier 70), input registers 60, and multiplier 70 (including components 80, 90, and 100 of that multiplier). Successive products produced by multiplier 70 in DSP block 230a are conveyed via locally and directly interconnected leads 204 and 252 to multiplexers 254a and 254b in DSP block 230b. These multiplexers 254 are programmed to route signals from leads 252 to registers 60, which now function as "pipeline" registers between the multiply and accumulate portions of the MAC circuitry.

As mentioned above, the interconnections 201 between conductors 204 and 252 in FIG. 4 are preferably special-purpose interconnection conductors that are added to PLD 10 for the purposes of this invention. The same is true for the interconnection 203 (further described below) between conductors 202 and 205 in FIG. 4. In other words, these connections between adjacent DSP blocks 230 are preferably not made using the more general-purpose interconnection resources of PLD 10.

Continuing with the discussion of DSP block 230b, the output signals of registers 60 are applied via leads 262 and appropriately programmed multiplexers 264b to final partial products addition circuitry 100. This circuitry 100 adds the latest product information from registers 60 to the previous accumulation of product information that is fed back from registers 110 in DSP block 230b. This feedback is via the leads 212 and appropriately programmed multiplexers 264a in DSP block 230b. The new accumulation produced by circuitry 100 in DSP block 230b is applied via appropriately programmed multiplexers 208 to registers 110, still in DSP block 230b.

The last sentence above actually applies to the 36 lower-order bits of the accumulation output by circuitry 100 in DSP block 230b. Any overflow (or 37th bit) of that accumulation is applied via locally and directly interconnected leads 202 and 205 to the N-bit incrementer 206 in DSP block 230a. Elements 206, 208, 110, and 212 in DSP block 230a operate to accumulate any such overflow from the basic accumulation performed by DSP block 230b. In particular, incrementer 206 adds any overflow data on lead 205 to any previous accumulation fed back from registers 110 to incrementer 206 via leads 212, all in DSP block 230a. Multiplexers 208 in DSP block 230a are programmed to apply the output signals of incrementer 206 to registers 110, still all in DSP block 230a.

The output of the MAC operation is available from output interfaces 120 in DSP blocks 230a and 230b. Output interface 120 in DSP block 230b supplies the 36 less-significant bits of the MAC output. Any more-significant bits of the MAC output are supplied by output interface 120 in DSP block 230a.

It will be apparent from the foregoing that this invention allows two multiplier blocks to be used together to perform a MAC operation, if desired. Relatively little circuitry needs to be added to each multiplier block to achieve this; and local, dedicated interconnections 201 and 203 are preferably used between adjacent multiplier blocks to avoid any extra usage of the more general-purpose interconnection resources of the PLD.

Figure 6:
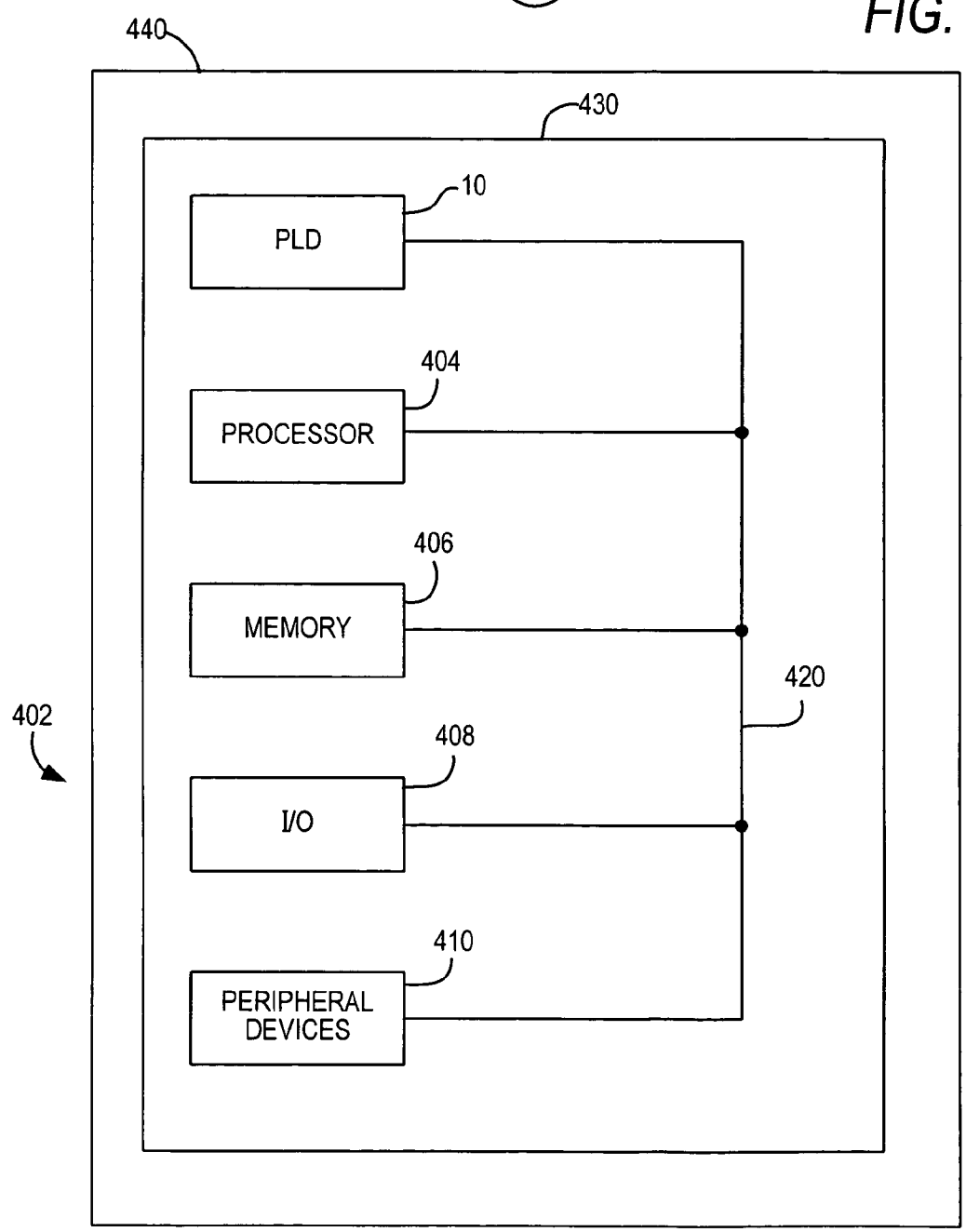
FIG. 6 is a simplified block diagram of an illustrative system that can be constructed in accordance with the invention.

FIG. 6 illustrates a PLD 10 of this invention in a data processing system 402. Data processing system 402 may include one or more of the following components: a processor 404; memory 406; I/O circuitry 408; and peripheral devices 410. These components are coupled together by a system bus or other interconnections 420 and are populated on a circuit board 430 (e.g., a printed circuit board) that is contained in an end-user system 440.

System 402 can be used in a wide variety of applications, such as computer networking, data networking, instrumentation, video processing, digital signal processing, or any other application where the advantage of using programmable or reprogrammable logic is desirable. PLD 10 can be used to perform a variety of different logic functions. For example, PLD 10 can be configured as a processor or controller that works in cooperation with processor 404. PLD 10 may also be used as an arbiter for arbitrating access to a shared resource in system 402. In yet another example, PLD 10 can be configured as an interface between processor 404 and one of the other components in system 402. It should be noted that system 402 is only exemplary, and that the true scope and spirit of the invention should be indicated by the following claims.

Various technologies can be used to implement PLDs having the features of this invention, as well as the various components of those devices. Examples of components suitable for use in PLDs are EPROMs, EEPROMs, pass transistors, transmission gates, antifuses, laser fuses, metal optional links, etc. For example, the programmable control elements in a PLD (e.g., element 310 in FIG. 5) can be SRAMs, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like. From the various examples mentioned above it will be seen that this invention is applicable to both one-time-only programmable and reprogrammable devices.

It will be understood that the foregoing is only illustrative of the principles of the invention, and that various modifications can be made by those skilled in the art, without departing from the scope and spirit of the invention. For example, the circuitry of the invention can be easily modified to increase or decrease the number of multiplier, multiplicand, and product bits supported.

The invention claimed is:

1. Multiplier circuitry comprising:
   partial products generation circuitry;
   partial products addition circuitry; and
   routing circuitry for selectively routing to the partial products addition circuitry either (a) partial products output by the partial products generation circuitry or (b) data previously output by the partial products addition circuitry and data that has not passed through the partial products generation circuitry.

2. The circuitry defined in claim 1 further comprising:
   incrementer circuitry for selectively incrementing data previously output by the incrementer circuitry with a signal that has not passed through the partial products generation circuitry or the partial products addition circuitry.

3. The circuitry defined in claim 1 further comprising:
   input register circuitry for outputting signals to the partial products generation circuitry and the routing circuitry.

4. The circuitry defined in claim 3 further comprising:
   input interface circuitry; and
   multiplexer circuitry for selectively applying to the input register circuitry either (a) signals from the input interface circuitry or (b) signals output by the partial products addition circuitry of another instance of multiplier circuitry that is substantially the same as the multiplier circuitry.

5. The circuitry defined in claim 1 further comprising:
output register circuitry that is capable of storing output signals of the partial products addition circuitry.

6. The circuitry defined in claim 5 wherein the data previously output by the partial products addition circuitry is derived from the output register circuitry.

7. The circuitry defined in claim 1 wherein the partial products addition circuitry includes an output lead for conveying an overflow output signal of the partial products addition circuitry.

8. The circuitry defined in claim 7 further comprising:
incrementer circuitry for selectively incrementing data previously output by the incrementer circuitry with the overflow output signal from another instance of multiplier circuitry that is substantially the same as the multiplier circuitry.

9. The circuitry defined in claim 8 further comprising:
output register circuitry; and
second routing circuitry for selectively applying to the output register circuitry either (a) output signals of the partial products addition circuitry or (b) output signals of the incrementer circuitry.

10. The circuitry defined in claim 9 wherein the data previously output by the incrementer circuitry is derived from the output register circuitry.

11. A programmable logic device comprising multiplier circuitry as defined in claim 1.

12. A digital processing system comprising:
processing circuitry;
a memory coupled to said processing circuitry; and
a programmably logic device as defined in claim 11 coupled to the processing circuitry and the memory.

13. A printed circuit board on which is mounted a programmable logic device as defined in claim 11.

14. The printed circuit board defined in claim 13 further comprising:
a memory mounted on the printed circuit board and coupled to the programmable logic device.

15. The printed circuit board defined in claim 13 further comprising:
processing circuitry mounted on the printed circuit board and coupled to the programmable logic device.

16. Digital signal processing circuitry comprising:
a plurality of multiplier blocks, each including partial products generation circuitry, partial products addition circuitry, output register circuitry, and multiplexer circuitry for selectively applying to the partial products addition circuitry either (a) partial products output by the partial products generation circuitry or (b) signals fed back from the output register circuitry and signals that have not passed through the partial products generation circuitry; and
interconnection circuitry for applying output signals of the partial products addition circuitry in a first of the multiplier blocks to the multiplexer circuitry in a second of the multiplier blocks as the signals that have not passed through the partial products generation circuitry of the second multiplier block.

17. The circuitry defined in claim 16 wherein each of the multiplier blocks further includes incrementer circuitry for selectively incrementing signals fed back from the output register circuitry with a signal from another one of the multiplier blocks.

18. The circuitry defined in claim 17 wherein the signal from another one of the multiplier blocks comprises an overflow output signal of the partial products addition circuitry in the another one of the multiplier blocks.

19. The circuitry defined in claim 17 wherein each of the multiplier blocks still further includes second multiplexer circuitry for selectively applying to the output register circuitry either (a) output signals of the partial products addition circuitry or (b) output signals of the incrementer circuitry.

20. The circuitry defined in claim 19 wherein the second multiplexer circuitry is programmably controlled.

21. The circuitry defined in claim 16 wherein each of the multiplier blocks further includes input register circuitry, output signals of which are applied to the partial products generation circuitry and the multiplexer circuitry as the signals that have not passed through the partial products generation circuitry.

22. The circuitry defined in claim 21 wherein each of the multiplier blocks further includes input interface circuitry and second multiplexer circuitry for selectively applying to the input register circuitry either (a) outputs of the input interface circuitry or (b) signals from the interconnection circuitry.

23. The circuitry defined in claim 22 wherein the second multiplexer circuitry is programmably controlled.

24. The circuitry defined in claim 16 wherein the multiplexer circuitry is programmably controlled.

25. A method of operating DSP circuitry that includes a plurality of multiplier blocks, each having partial products generation circuitry, partial products addition circuitry for adding partial products output by the partial products generation circuitry in a multiply mode of operation, and output register circuitry for registering output signals of the partial products addition circuitry in the multiply mode of operation, the method comprising:
selectively using the partial products addition circuitry in a first of the multiplier blocks to add the output signals of the partial products addition circuitry in a second of the multiplier blocks and output signals of the output register circuitry in the first of the multiplier blocks.

26. The method defined in claim 25 wherein each of the multiplier blocks further includes incrementer circuitry, and wherein the method further comprises:
selectively using the incrementer circuitry in the second multiplier block to accumulate any overflow from the partial products addition circuitry in the first multiplier block.

* * * * *